United States Patent [19]

Hine

[11] Patent Number: 5,102,291

[45] Date of Patent: * Apr. 7, 1992

[54] METHOD FOR TRANSPORTING SILICON WAFERS

[75] Inventor: Derek L. Hine, Portola Valley, Calif.

[73] Assignee: Hine Design Inc., Palo Alto, Calif.

[*] Notice: The portion of the term of this patent subsequent to Jan. 9, 2007 has been disclaimed.

[21] Appl. No.: 438,479

[22] PCT Filed: May 23, 1988

[86] PCT No.: PCT/US88/01728

§ 371 Date: Nov. 21, 1989

§ 102(e) Date: Nov. 21, 1989

[87] PCT Pub. No.: WO88/09303

PCT Pub. Date: Dec. 1, 1988

Related U.S. Application Data

[63] Continuation-in-part of Ser. No. 323,207, Mar. 13, 1989, Pat. No. 4,892,455, which is a continuation of Ser. No. 052,496, May 21, 1987, abandoned.

[51] Int. Cl.⁵ .................................. B65G 1/06
[52] U.S. Cl. .................................. 414/786; 414/417; 414/331; 414/757; 414/433
[58] Field of Search .......... 414/331, 417, 431, 432, 414/433, 741, 751, 754, 757, 786; 901/8; 198/468.2; 294/31.1, 34; 221/75, 222, 279

[56] References Cited

U.S. PATENT DOCUMENTS

| | | | |
|---|---|---|---|
| 3,160,295 | 12/1964 | Roark | 414/331 |
| 3,297,134 | 1/1967 | Pastuszak | 414/757 X |
| 3,480,158 | 11/1969 | Pandgiris et al. | 414/757 |
| 3,712,483 | 1/1973 | Messervey | 221/222 X |
| 3,820,647 | 6/1974 | Waugh, Jr. et al. | 414/757 X |
| 3,972,424 | 8/1976 | Levy et al. | 414/757 X |
| 3,982,627 | 9/1976 | Isohata | 414/757 |
| 4,094,426 | 6/1978 | Vogel | 414/431 |
| 4,213,318 | 7/1980 | Priebe | 414/757 X |
| 4,407,627 | 10/1983 | Sato et al. | 414/757 |
| 4,427,332 | 1/1984 | Manriquez | 414/331 |
| 4,449,885 | 5/1984 | Hertel et al. | |
| 4,483,434 | 11/1984 | Miwa et al. | 414/757 X |
| 4,621,967 | 11/1986 | Masada | |
| 4,655,584 | 4/1987 | Tanaka et al. | 414/757 X |
| 4,662,811 | 5/1987 | Hayden | 414/433 |
| 4,685,206 | 8/1987 | Kobayashi et al. | 414/754 X |
| 4,691,817 | 9/1987 | Haar | |
| 4,787,814 | 11/1988 | Vaerman | 414/757 |
| 4,813,840 | 3/1989 | Prabhakar et al. | 414/757 X |
| 4,875,824 | 10/1989 | Moe et al. | 901/8 X |
| 4,887,904 | 12/1989 | Nakazato et al. | 356/375 |

FOREIGN PATENT DOCUMENTS

| | | | |
|---|---|---|---|
| 3004462 | 8/1981 | Fed. Rep. of Germany | 414/757 |
| 62-188642 | 8/1987 | Japan | 414/757 |
| 85564 | 7/1957 | Netherlands | 414/433 |
| 879681 | 12/1981 | U.S.S.R. | 414/757 |
| 2171978 | 9/1986 | United Kingdom | |
| 84/04739 | 12/1984 | World Int. Prop. O. | |

Primary Examiner—Robert J. Spar
Assistant Examiner—Robert S. Katz
Attorney, Agent, or Firm—T. H. P. Richardson

[57] ABSTRACT

Method for transporting silicon wafers. Damage to the wafers is minimized by supporting the wafer solely by wafer supports which contact the wafer only around the periphery thereof. Preferred supports are flanged wheels which are rotatable in the plane of the wafer and are mounted on wafer supports which can be moved relative to each other between an open position and a closed position in which the wafer is supported by the supports. The flanged wheels can cooperate with the wafer and/or be driven by a motor as the wafer supports move into the closed position, to align the wafer laterally and/or rotationally.

8 Claims, 2 Drawing Sheets

METHOD FOR TRANSPORTING SILICON WAFERS

This application is a continuation-in-part of Ser. No. 07/323,207 filed Mar. 13, 1989, now U.S. Pat. No. 4,892,455, which is a continuation of 07/052,496, filed May 21, 1987, now abandoned.

BACKGROUND OF THE INVENTION

1. Field of the Invention

This invention relates to methods for transporting silicon wafers, in particular such methods in which the wafer is aligned, and apparatus which is suitable for use in such methods. It includes the methods and apparatus disclosed in, commonly assigned U.S. application Ser. No. 052,496, filed May 21, 1987, now abandoned, as well as further improvements of that method and apparatus.

2. Introduction to the Invention

In the manufacture of solid state devices, silicon wafers are moved between different work stations, often in cassettes which hold a number of spaced-apart wafers stacked next to each other in pockets. Many processes require that the wafer is precisely aligned. The alignment required may be the precise positioning of the center of the wafer and/or the precise orientation of the wafer relative to its crystalline plane, which is indicated on the wafer by a marker of some kind, usually a flat or notch on the perimeter of the wafer. The transporting of individual wafers (including in particular their removal from cassettes, their placement into cassettes, and their alignment, as well as their simple transport from one location to another) is a matter of vital concern to the semiconductor industry.

Known methods of transporting individual silicon wafers involve contact between (a) the underside of the wafer and (b) solid support surfaces or air jets which are likely to contain solid particles. It is already known that these methods can damage or contaminate the underside of the wafer, but this has not hitherto been a matter for concern. However, it has now been found that these known methods can also damage or contaminate the working surface of the wafer.

SUMMARY OF THE INVENTION

This invention provides for the first time, a method and apparatus for transporting an individual silicon wafer in which there is substantially no inherent danger of damaging or contaminating the working surface of the wafer. The term "transporting" is used herein in the broad sense indicated above to include any process in which the wafer undergoes directional and/or rotational movement.

This invention not only provides important advantages in the ease, reliability and speed with which wafers can be transported, in particular when alignment of the wafers is needed. In addition, since the invention substantially reduces or eliminates the possibility of damage to the underside of the wafer, it also opens the way to silicon wafers which have two working surfaces. Thus the method of the invention can be used to transport wafers which have been etched or plated or otherwise modified on both surfaces thereof. For example, connection pads which are now placed on the working surface, where they occupy valuable space, can now be placed on the opposite surface. Such novel silicon wafers form part of the present invention.

In another aspect, this invention provides a method of transporting an individual silicon wafer wherein the wafer is supported solely by means of wafer supports, preferably flanged rotatable wheels, which contact the wafer only around the periphery thereof, thus eliminating the need to contact either of the surfaces of the wafer. A preferred method also includes the step of moving the wafer supports so as to move the wafer, while it is supported and contacted only by the wafer supports, until it has a desired alignment. The movement of the wafer may be lateral only, so as to precisely locate the center of the wafer, or rotational, so as to precisely locate an alignment marker which indicates the crystalline plane of the wafer, or both.

In another aspect, this invention provides apparatus which is suitable for use in the method defined above and which comprises (1) a mounting frame; and
(2) at least two wafer carriers which
   (a) are movably mounted on the frame,
   (b) comprise a plurality of wafer supports, and
   (c) can be moved relative to each other between (i) a closed position in which a wafer to be transported can be supported solely by contact between the periphery of the wafer and the wafer supports and (ii) an open position in which a wafer to be aligned can be passed freely between the wafer supports.

In one preferred embodiment, the wafer can be moved laterally and/or rotationally into a desired alignment by movement of the wafer supports, and the apparatus includes means for determining when a wafer supported by the wafer supports is correctly aligned. In another preferred embodiment, the wafer carriers and frame are such that a cassette of wafers can be placed adjacent to the apparatus, together with a means for moving the cassette and the wafer carriers relative to each other, and the wafer carriers can then be used for successively transporting individual wafers from the cassette.

BRIEF DESCRIPTION OF THE DRAWINGS

The invention is illustrated by the following drawings in which.

DETAILED DESCRIPTION OF THE INVENTION

Figure 3:
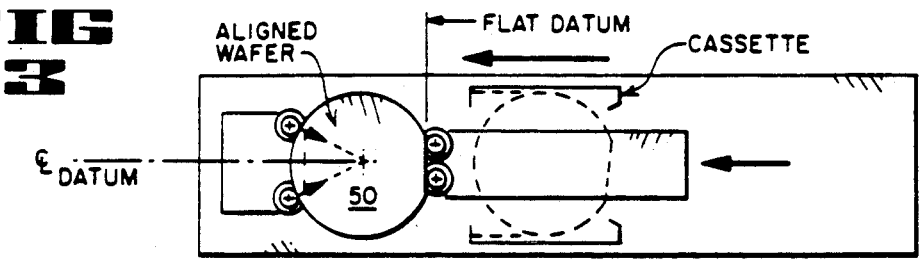
FIGS. 2 and 3 are plan views of the apparatus in FIG. 1 at successive stages of its operations.
Figure 2:
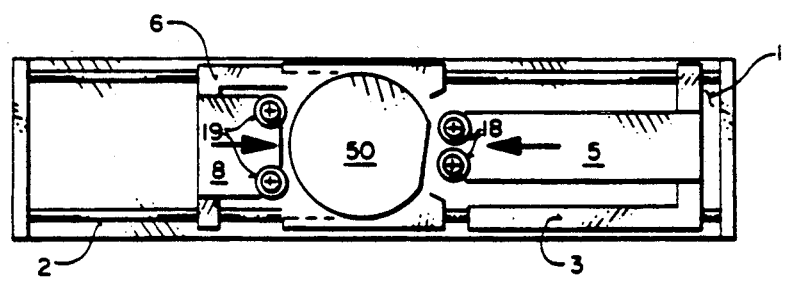
Figure 1:
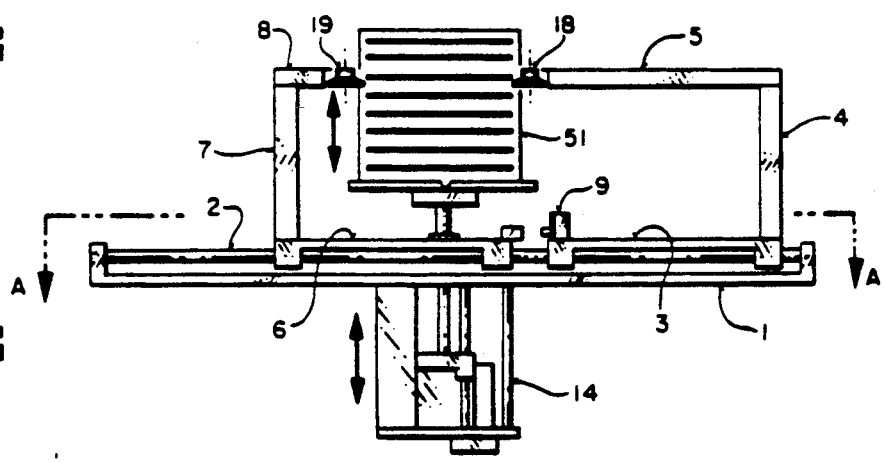
FIG. 1 is a side view of an apparatus of the invention.

Silicon wafers are generally in the form of circular discs having a diameter of, for example, 4, 5, 6 or 8 inches, and having on the periphery thereof a flat or a notch which indicates the crystalline axis of the silicon. Many of the treatments to which silicon wafers are subjected are critically dependent on alignment. There is, therefore, a need for transport systems which align the wafer very precisely, or which check or maintain such alignment. One of the advantages of the present invention is that it makes it very simple to check whether a wafer has a desired alignment, and if it does not, to move the wafer laterally and/or rotationally into a desired alignment. The present invention will, therefore, chiefly be described by reference to methods and apparatus in which the transport of the wafer includes alignment thereof. It will be understood, however, that where appropriate, exemplary and preferred features of the invention are applicable to all forms of wafer transport. Similarly, where an exemplary or preferred feature is specifically described in a particular context or in combination with one or more particular features, such an exemplary or preferred feature can where appropriate also be used in other contexts and in combination with one or more other features described elsewhere in this specification.

In one preferred method in which a wafer is aligned, (a) the wafer supports comprise first and second pairs of wheels which are rotatable in the plane of the wafer, the plane containing the axes of the wheels in the first pair is maintained parallel to the plane containing the axes of the wheels in the second pair, and the center of the wafer lies between the two pairs of wheels, and (b) the first and second pairs of wheels are urged towards each other and thereby align the wafer so that its center lies on the line joining (a) the mid point of a line joining the axes of the wheels of the first pair in the plane of the disc and (b) the mid point of a line joining the axes of the wheels of the second pair in the plane of the disc.

When this method is used with a wafer having an alignment flat on its periphery and one of the wheels contacts the flat, the wafer will not only be aligned laterally but also will be rotated so that it is aligned rotationally.

Other methods can be employed wherein the desired rotational alignment of the wafer can be brought about by combining the alignment discontinuity on the periphery of a wafer with directional forces applied to the wafer by the wafer support means. Such directional forces (and the other directional forces referred to herein) can be generated by springs, preferably constant force extension springs, by hydraulic pressure, by pneumatic pressure (in which, for example, the air pressure in a cylinder can be adjusted to achieve a desired force) or otherwise. However, rotational alignment in this way is difficult or impossible when the discontinuity is very small (e.g. in the form of an alignment notch) or non-existent, and is of limited value when the wafers are not supplied in an approximately pre-aligned orientation, e.g. within 10° of the desired alignment. In such circumstances, it is preferred to use a motor, preferably an electric motor, to drive at least one of the wafer supports to effect or assist rotation of the wafer into a desired alignment. The motor can be coupled to at least one, preferably at least two, wheels which bear against the periphery of the device, preferably via an elastomeric coating on the bearing surface of the wheel. However the desired rotational alignment is achieved, a sensor can be used to determine when the wafer is aligned. Any suitable physical, optical, electrical or other sensor can be used. For a notched wafer, a pin which is smaller than the notch can be urged against the periphery of the wafer and will enter the notch when alignment has been achieved. When a motor is used to rotate the wafer, it is important that it should be stopped as rapidly as possible after the sensor detects alignment. We have found it useful, when using an electric motor, to employ a magnetic brake or a control circuit which reverses the direction of current flow through the motor for a very short time after the sensor determines that the wafer is correctly aligned.

Preferred wafer supports for this invention are wheels which are rotatable in the plane of the wafer. The wheels can be spaced regularly or irregularly around the wafer and can be biassed to assist in achieving desired alignment, e.g. for flat finding as described above or simply biassed in a radial direction. When the wafer is rotated with the aid of a motor, preferably one or more of the support wheels are rotated by the motor. The wheels preferably comprise elastomeric portions (or tires) which bear against the wafer, thus cushioning the wafer against physical and electrical damage. Preferably at least some of the wheels comprise flanges which are inclined to the axis of rotation of the wheel so that when the wafer carriers move from the open position to the closed position with a wafer between the wafer supports, the wafer moves up the flange in a direction at right angles to the plane of the wafer. Such upward movement can be accompanied by lateral movement to align the wafer laterally. When the wafer is horizontal a single flange on the lower side of the wheel is appropriate. When the wafer is vertical, a flange each side of the wheel is preferred.

In addition to the mounting frame and the wafer carriers, the apparatus of the invention preferably also comprises (3) closing means which continuously and resiliently urges the wafer carriers towards the closed position, and (4) motion-controlling means which (i) when the wafer carriers are in the open position, can overcome the force exerted by the closing means, and (ii) can be operated to permit the wafer carriers to move in a controlled manner into the closed position.

Silicon wafers are brittle and it is important to minimize the impact of the wafer supports against the periphery of the wafer. We have found that for this and other purposes, for example to permit minimum overall transport times without danger of accidentally releasing the wafer, it is desirable to control the linear movement of the wafer carriers in a cyclic fashion, preferably so that the supports approach the edge of the wafer at a very low speed. This can be achieved in any suitable way, for example through the use of a magnetic clutch which is activated when the wafer is properly located. However, we have found that a simple and reliable method of achieving this result is to drive the motion-controlling means for the wafer carrier in a cyclic manner, preferably in a cycloid manner achieved by translating the linear motion of a gear (or other) motor by means of a crank and a connecting rod, for example as described below in connection with FIG. 8. In the same way, a reduction of the linear speed at which the wafer is transported can be achieved at one or more intermediate points along, and/or at the end of, a delivery route, e.g. from a cassette to a work station. At such intermediate points, the wafer can for example be viewed for identification marks, or the transport can be interrupted for a desired period, e.g. for a few seconds while the wafer is marked with a laser. Suitable cyclic driving can provide, for example, ramped sinusoidal acceleration and deceleration at both ends of a route, thus facilitating precise positioning of the wafer at the limits of the route.

As briefly noted above, the invention is particularly useful for transporting an individual wafer from a stack of wafers stored in a cassette. For this purpose, the apparatus of the invention preferably comprises two wafer carriers, each of which comprises (a) a yoke which is slidably mounted on the frame,
(b) a riser which is secured to the yoke and extends outwardly from the yoke for a distance greater than the corresponding dimension, i.e. height or width, of the cassette; and
(c) a presenter which is secured to the riser and on which at least two of the wheels are mounted;

the presenters and the wheels mounted thereon being thin enough to fit between the adjacent wafers in the cassette when the wafer carriers are moved from the open position to the closed position.

Such apparatus can be used merely to align the wafer and then to replace it in the cassette, or it can be used to deliver the wafer to a location outside the cassette, optionally aligning the wafer before, during or after the linear movement of the wafer. For such delivery, the apparatus preferably further comprises (6) means for moving the wafer carriers between (i) a pick-up location at which a wafer in the cassette can be picked up and (ii) a release location at which a wafer carried by the wafer carriers is completely outside the cassette and at which the wafer carriers can be moved into the open position to release the wafer.

The yoke carrying the wheels can be configured with horizontal or vertical support structure. With a vertical support structure, it is possible to provide the necessary clearance to transport cassettes laterally (horizontally and perpendicular to the presenter motion) through the yoke/presenter mechanism when it is in the open position. This makes it possible to line up one or more additional cassettes to allow continuous machine operation. "Processed" cassettes, not located at the elevator "work" station, can then be exchanged with "unprocessed" cassettes during normal machine operation. If the presenter structure is configured horizontally a more compact mechanism can be designed but it is restricted to single cassette operation.

Figure 4:
FIG. 4 is a detailed view of part of FIG. 1.

Referring now to FIGS. 1 to 5 of the drawing, these show preferred apparatus for laterally and rotationally aligning wafers 50 which have been approximately prealigned in a cassette 51 and which have an alignment flat on the periphery thereof. The apparatus comprises;

a mounting frame 1 to which are secured fixed linear slides 2;

a first wafer carrier which comprises (a) a first yoke 3 which slides with a linear motion along the slides 2, (b) a first riser 4 which is secured to the yoke 3 and which is tall enough to reach the top slot of a cassette whose supporting platform is above the sliding parts of the yoke, (c) a first presenter 5 which is secured to the riser 4, and (d) two flanged wheels 18, each of which has a flange 181 and an elastomeric driving surface 182, which are mounted on the presenter 5 and which are freely rotatable in the same plane as the wafer, and which are shown in greater detail in FIG. 4;

a second wafer carrier which comprises (a) a second yoke 6 which slides with a linear motion along the same slides as (or slides parallel to those used by) the first yoke, (b) a second riser 7 which is secured to the yoke 6 and which is as tall as the first riser, (c) a second presenter 8 which is secured to the riser 7, and (d) two flanged wheels 19 which are identical to the wheels 18, which are mounted on the presenter 8, and which are rotatable in the same plane as the wafer;

a sensor 9 which indicates when the wafer is precisely aligned;

a slotted plate 10 which slides on the same slides as (or slides parallel to those used by) the yokes, and is attached to a linear actuator 13 and, through the slots, to each of the yokes, the slots being sized and positioned to allow limited relative motion of the yokes between the open and closed positions;

a lever 11 which is attached at each end to one of the yokes and which has a cam follower bearing 20 fixed thereto and aligned with fixed stops 21 and 22 (alternatively a flexure member or a tension link attached at one end of the lever can be used in place of the cam follower);

a tension spring 12 which is attached to the yokes and pulls them towards each other with a light and controlled force which is sufficient to hold a wafer placed between the flanged wheels without causing damage to the wafer;

a linear actuator 13 which is secured to the lever 11 and which, in combination with the spring 12 and the stops 21 and 22, controls the movement of the yokes relative to each other and relative to the mounting frame; and an elevator 14 which is fixed to the mounting frame and can raise and lower the cassette so that each wafer stored in the cassette is in turn positioned into the plane of the presenters.

In operation of the apparatus shown in FIGS. 1-5, the cassette 51, loaded with approximately prealigned wafers 50, is placed on the elevator 14. The wafer carriers are in the open position. The bottom wafer is indexed by the elevator into the plane of the wheels on the presenters.

The linear actuator (13) starts its movement from the limit position in which the lever fulcrum (1) is hard against the stop (21), thus causing the spring (12) to be stretched and the presenters to be in the open position. As the linear actuator moves the slotted plate this permits the lever 11 to rotate and the spring (12) to contract, thus moving the first yoke with its presenter towards the wafer. The second yoke (6) and presenter (8) are moved towards the wafer from the other side by the other end of the lever (11) under the same spring force. As the wheels 18 and 19 contact the wafer, the wafer is lifted by the tapered flanges of the wheels, and as the wheels close on the wafer, the flat is automatically aligned and the wafer is centered as the pairs of wheels move together under the spring force (12). When the wheel perimeters are in close contact with the wafer they stop moving closer together. At this point the alignment sensing switch (9) is activated indicating that the flat has been correctly located. If the flat is not located at this point, a control system switches off the linear actuator and sends a default signal. If the flat is correctly located, continued movement of the linear actuator causes the wafer to be moved out of the cassette. While the complete assembly of two yokes with their respective presenters and the wafer move out, the yokes are actually being held together by the spring (12) and held apart by the wafer. If the speed of the assembly is changed too rapidly, the inertial and frictional forces could overcome the spring tension and cause the wafer to be released during travel or cause too much compressive force to be applied to the wafer at the other end of the route thereby causing damage. To avoid this, a magnetic or similar brake (23) can be used, to lock the yokes in their relative positions when triggered by the sensing switch (9).

The presenter and supporting yoke, riser assemblies can be constructed with the necessary clearances to allow cassettes located on platforms to be transported laterally into and out of the presenter work station. The cassette transporting mechanism can be automated to allow continuous machine operation while "processed" cassettes are exchanged by an operator or robot cassette loader. When such a cassette, with platform, is positioned in the work station the elevator engages and lifts the platform to index each wafer in turn into the operating plane of the presenter.

Figure 6:
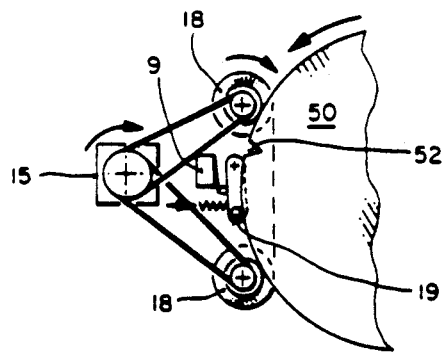
FIG. 6 is a plan view of a part of the apparatus of FIG. 1 modified to provide motorized rotation of the wafer.

Referring now to FIG. 6, this shows the use of a pin 19 as an alignment sensor for a wafer 50 having an alignment notch 52. The pin 19 is spring-loaded against the periphery of the wafer 50 and enters the notch when the wafer is aligned. Also shown in FIG. 6 is a motor 15 which is coupled to flanged wheels 18 for rotating the wafer 50 into the desired alignment. When the pin 19 enters the notch 52, it activates a detector switch 9 which disconnects the motor 15.

Figure 7:
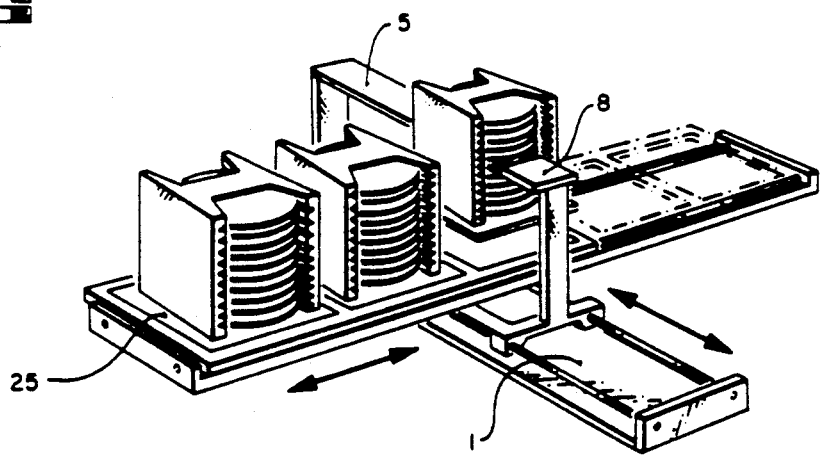
FIG. 7 is a perspective sketch of a multi cassette transport mechanism in association with apparatus of the invention.

Referring now to FIG. 7, this shows how a plurality of cassettes mounted on a platform 25 can be fed successively to an apparatus as shown in FIGS. 1 to 5.

Figure 5:
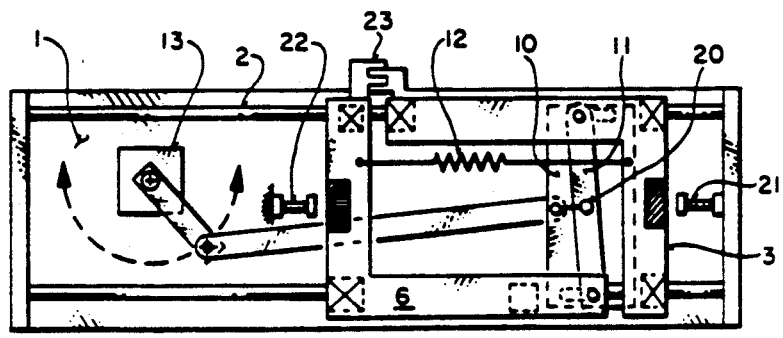
FIG. 5 is a cut away plan view on line AA of FIG. 1.
Figure 8:
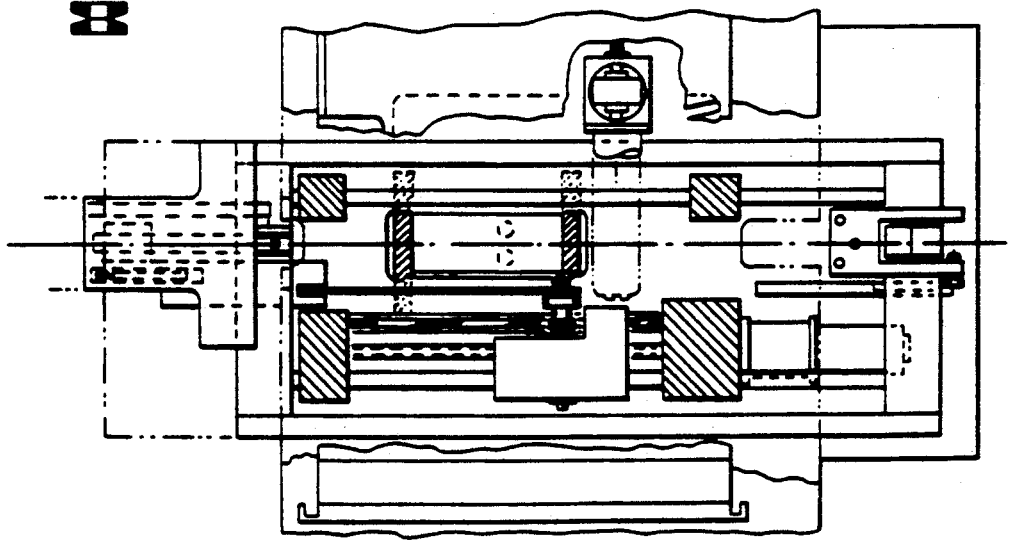
FIG. 8 illustrates a preferred drive mechanism for controlling the motion of the wafer carriers in apparatus of the invention.

Referring now to FIG. 8, this shows how a cycloid drive means can be fitted between an electric motor and a linear actuator, e.g. as shown in FIG. 5, to provide a sinusoidal pause at the pick-up location, at the release location and at an intermediate location, with sinusoidally ramped acceleration either side of each pause. This is achieved by a cycloid drive mechanism which is driven at a constant speed by a motor-driven lead screw (or like device). The cycloid drive mechanism comprises a connecting rod which is attached at one end to the second yoke and at the other to a crank attached to a rotatable pinion mounted in bearings in the drive housing. It is thus moved along a toothed rack that causes it and the crank to rotate as the drive housing is moved. The crank pin is located at a radius the same as (or close to) the radius of the pinion, so that it moves along a cycloid path (similar to the valve on a bicycle wheel). The crank pin is arranged to rotate through two complete revolutions during its stroke, and thus provides sinusoidal ramped acceleration to a maximum speed at ¼ stroke then reducing speed to a full stop at ½ stroke, where the wafer is picked up followed by acceleration up to full speed at ¾ stroke, then smooth deceleration to zero speed at the end of stroke. By operating the motor "stop" switch close to this position, extremely accurate positioning is achieved.

I claim:

1. A method of transporting an individual silicon wafer which is in the form of a generally circular disc having a top surface, a bottom surface, a principal plane which lies between the top surface and the bottom surface, a periphery, and a center which coincides with the origin of said generally circular disc, which method comprises
    (a) supporting the wafer solely by means of wafer supports which contact the wafer only around the periphery thereof, said wafer supports being wheels which are rotatable in the principal plane of the wafer; and
    (b) moving the wafer supports, while the wafer is supported and contacted only by the wafer supports.

2. A method according to claim 1 wherein step (b) comprises moving the wafer laterally so as to precisely locate the center of the wafer.

3. A method according to claim 1 wherein the periphery of the wafer includes (i) an alignment flat which is a chord of the disc or (ii) an alignment notch and wherein step (b) comprises rotating the wheels in the principal plane of the wafer so as to rotate the wafer into a desired rotational alignment.

4. A method according to claim 3 wherein step (b) comprises rotating at least two of the wheels by means of an electric motor.

5. A method according to claim 1 wherein step (b) comprises moving the wafer laterally so as to precisely locate the center of the wafer and moving the wafer rotationally so as to precisely locate the alignment marker which indicates the crystalline plane of the wafer.

6. A method according to claim 1 which further comprises etching the top surface and the bottom surface of the wafer before step (a).

7. A method according to claim 1 which further comprises plating the top surface and the bottom surface of the wafer before step (a).

8. A method according to claim 1 which further comprises, before step (a), etching the top surface of the wafer and plating the bottom surface of the wafer.

* * * * *